United States Patent [19]

Heys, Jr. et al.

[11] Patent Number: 4,682,325
[45] Date of Patent: Jul. 21, 1987

[54] SYSTEM FOR SELECTIVELY COUPLING A PLURALITY OF STATIONS INTO A SINGLE COMMUNICATIONS PATH

[75] Inventors: George Heys, Jr.; Rex A. Aleshire; Frank Hines; William M. Belknap, all of Cambridge, Ohio

[73] Assignee: NCR Corporation, Dayton, Ohio

[21] Appl. No.: 686,579

[22] Filed: Dec. 27, 1984

[51] Int. Cl.$^4$ .............................................. H04J 3/02
[52] U.S. Cl. ..................................... 370/85; 333/100
[58] Field of Search ...................... 370/85, 86; 375/36; 333/100, 123, 124, 32, 33

[56] References Cited

U.S. PATENT DOCUMENTS

| | | | |
|---|---|---|---|
| 3,800,097 | 3/1974 | Maruscak et al. | 179/98 |
| 3,881,160 | 4/1975 | Ross | 333/8 |
| 4,254,501 | 3/1981 | Griffith et al. | 375/9 |
| 4,412,326 | 10/1983 | Limb | 370/85 |
| 4,476,543 | 10/1984 | Quinones et al. | 375/36 |

FOREIGN PATENT DOCUMENTS 461192 11/1937 United Kingdom .

OTHER PUBLICATIONS

IBM Technical Disclosure Bulletin, vol. 26, No. 4, Sep. 1983, pp. 2118-2119.

Sixth Euromicro Symp. on Microprocessing, Sep. 16-18, 1980, P. Borrill, "Microprocessor Bus Structures and Standards".

Proceedings IEEE, International Symposium on Subscriber Loop & Services, Sep. 20-24, E. Arnon et al., pp. 55-61.

Primary Examiner—Douglas W. Olms
Attorney, Agent, or Firm—Wilbert Hawk, Jr.; Albert L. Sessler, Jr.

[57] ABSTRACT

A system is disclosed for selectively serially coupling a plurality of stations in a communications network into a single communications path. In the system of the invention, a plurality of tap boxes are serially coupled into the single communications path. Each station is coupled to a desired associated one of the tap boxes by way of an associated tap cable. When the tap cable is connected to a first portion of the tap box, a first impedance corresponding to the characteristic impedance of the single communications path is serially coupled into the single communications path to enable the station associated with the tap cable to be coupled to the single communications path by way of the first impedance. When the tap cable is connected to a second portion of the tap box, the first impedance is effectively removed from the single communications path and a test impedance is coupled to the tap cable to enable the station associated with the tap cable to test itself. In a first embodiment, the first and second portions of the tap box are respectively the tip and ring contacts of a stereo jack. In a second embodiment, the first and second portions of the tap box are separate audio jacks. In each embodiment, a connection means, such as a monaural plug, is connected to the end of each tap cable and is used to selectively couple the tap cable to either of the first and second portions of a desired tap box.

20 Claims, 5 Drawing Figures

SYSTEM FOR SELECTIVELY COUPLING A PLURALITY OF STATIONS INTO A SINGLE COMMUNICATIONS PATH

BACKGROUND OF THE INVENTION

1. Field of the Invention

The present invention relates to a communications network of data stations which may be processors, terminals and the like and more particularly to a system for selectively coupling a plurality of such data stations into a single communications path.

2. Description of the Prior Art

Several known prior art techniques have been proposed for coupling a plurality of electronic units into a single communications path.

U.S. Pat. No. 4,412,326 illustrates in FIG. 1 the serial insertion of conventional passive T-connectors or taps, (40-1 through 40-N) into a bidirectional communications signal path (10) between reflection-limiting terminators (20 and 30) so that a plurality of stations (30-1 through 30-N) can be coupled into the resultant communications link.

The background art known to the applicants at the time of the filing of this application is as follows:

U.S. Pat. No. 4,412,326, Collision Avoiding System, Apparatus and Protocol For A Multiple Access Digital Communications System Including Variable Length Packets, by J. O. Limb.

SUMMARY OF THE INVENTION

Briefly, a system is provided for selectively serially coupling a plurality of stations in a communications network into a single communications path.

In accordance with one aspect of the invention, there is provided, in a communications network having a plurality of stations including first and last stations and a single communications path having a preselected characteristic impedance, a system for selectively coupling the plurality of stations into the single communications path, said system comprising, in combination, a plurality of tap boxes serially coupled into the single communications path, and a plurality of connection means for selectively coupling the stations to selected ones of said plurality of tap boxes, each of said tap boxes comprising: a first impedance equivalent to the characteristic impedance of the single communications path; and receptacle means having a first portion and being responsive to the coupling of a said connection means to said first portion for coupling said first impedance serially into the single communications path and for coupling the station associated with said connection means into the single communication path by way of said first impedance.

BRIEF DESCRIPTION OF THE DRAWINGS

Various objects, features, and advantages of the invention, as well as the invention itself, will become more apparent to those skilled in the art in the light of the following detailed description taken in consideration with the accompanying drawings wherein like reference numerals indicate like or corresponding parts throughout the several views and wherein.

DESCRIPTION OF THE PREFERRED EMBODIMENT

Figure 1:
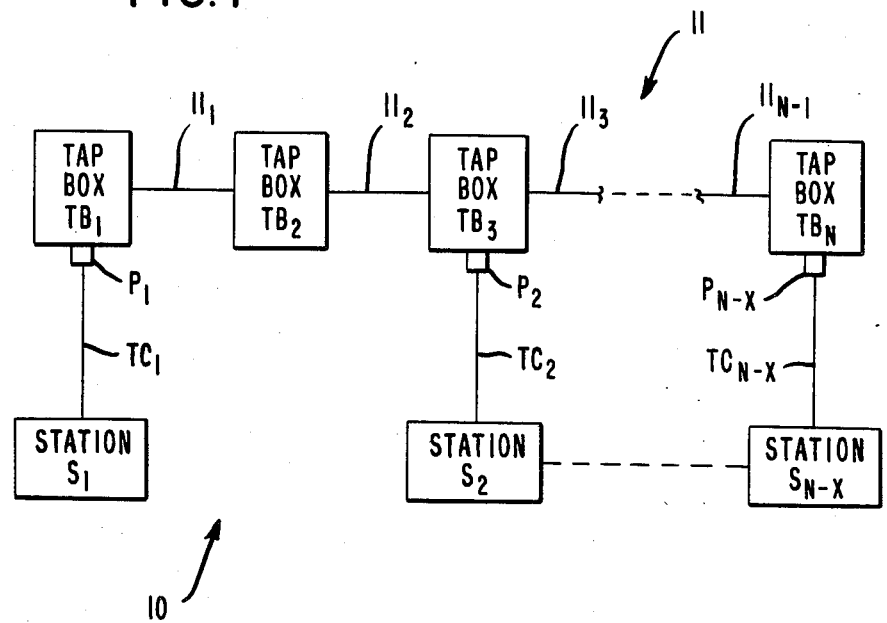
FIG. 1 is a schematic block diagram of a plurality of stations selectively coupled to a single communications path by way of the system of the invention.

Referring now to the drawings, FIG. 1 illustrates a communications network 10 which broadly shows the system of the invention for selectively coupling a plurality of stations $S_1$-$S_{N-X}$ into a single or common bidirectional communications path 11, where X can be any integer between 1 and $N-3$. The communications network 10 can be formed, for example, within a store building, within a city or within some larger geographical area, depending on the desired application for the network 10. The stations $S_1$-$S_{N-X}$ any be comprised of processors, terminals or the like.

A plurality of tap boxes $TB_1$-$TB_N$ are serially coupled into the path 11 by path segments $11_1$-$11_{N-1}$ to form part of the path 11. Each of the path segments $11_1$-$11_{N-1}$ can be, for example, a coaxial cable or a twisted pair cable. The plurality of stations $S_1$-$S_{N-X}$ are respectively coupled to connection means or tap cables $TC_1$-$TC_{N-X}$. Couplers $P_1$-$P_{N-X}$, such as plugs, are respectively connected to the ends of the tap cables $TC_1$-$TC_{N-X}$ to readily enable the tap cables $TC_1$-$TC_{N-X}$ to be respectively coupled to, for example, tap boxes $TB_1$ and $TB_3$-$TB_N$. In this manner, any of the tap cables $TC_1$-$TC_{N-X}$ can be readily inserted into, as well as readily removed from, any desired ones of the tap boxes $TB_1$-$TB_N$. As will be explained later, by coupling a tap cable $TC_2$, for example, into a tap box $TB_3$, for example, the station $S_2$ is coupled into the path 11 by way of the tap box $TB_3$.

Although N-X stations ($S_1$-$S_{N-X}$) are shown in FIG. 1, any number of stations between 2 and N may be used in a network 10 using N tap boxes ($TB_1$-$TB_N$). As will be explained later, any of the stations being used in the network 10 can be readily coupled to or readily decoupled from a desired tap box (by way of the tap cable associated with the station) without degrading the performance of the communications network 10.

Figure 3:
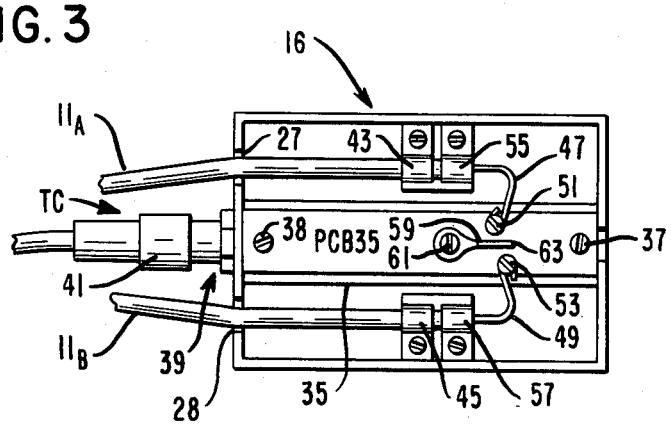
FIGS. 2 and 3 illustrate how a tap box of FIG. 1 is assembled and serially coupled into the single communications path of FIG. 1.
Figure 2:
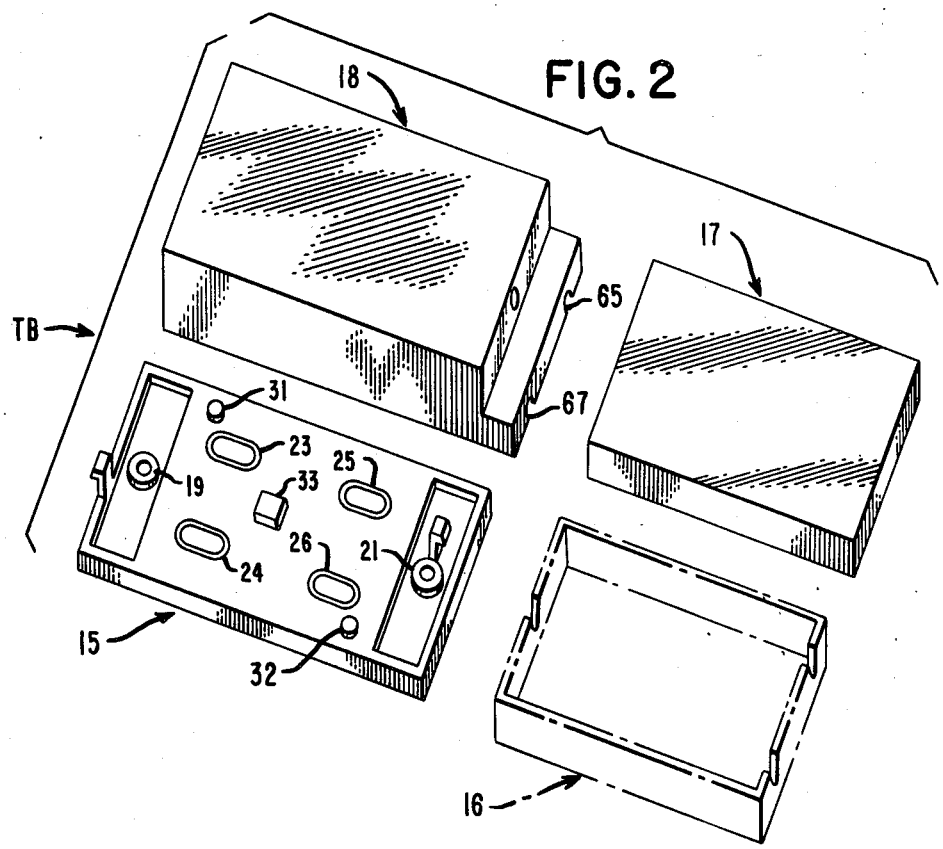

FIGS. 2 and 3 illustrate how a tap box of FIG. 1 is assembled and serially coupled into the single communications path 11 of FIG. 1.

As shown in FIG. 2, a tap box TB is comprised of a plastic back plate 15, a metal housing portion 16, a metal lid 17 and a large plastic cover 18. The housing portion 16 and its contents are shown in greater detail in FIG. 3.

The plastic back plate 15 may be permanently mounted in the desired position and orientation to, for example, a wall (not shown) by screws (not shown) which pass through holes 19 and 21 in the plate 15. Knock-out portions 23-26 are provided in the back plate 15 to enable, for example, coaxial cables or path segments (such as $11_1$-$11_{N-1}$ in FIG. 1) to come from the wall when some or all of the cables $11_1$-$11_{N-1}$ run out of sight behind the wall. When the cables, such as coaxial cables $11_A$ and $11_B$ in FIG. 3, are to be run along the outer surface of the wall, slots 27 and 28 in the tap box housing portion 16 (FIG. 3) enable the cables $11_A$ and $11_B$ to enter and exit the housing portion 16. In such a case, none of the knock-outs 23-26 in the back plate 15 needs to be removed.

After the back plate 15 is mounted to a wall, the metal housing portion 16 is first properly oriented with respect to locating pins 31 and 32 on the back plate 15 before being snapped onto an upraised portion or snap 33, located in the middle of the back plate 15, by conventional snapping means (not shown) on the underside of the housing portion 16. Also located on the underside of the housing portion 16 are two holes (not shown) for respectively receiving the locating pins 31 and 32. Note that with this mounting arrangement the housing portion 16 can be readily mounted onto the back plate 15 in either of two orientations, each being 180 degrees of angular rotation from the other. Similarly, the housing portion 16 can readily be unsnapped or removed from the back plate 15.

After the housing portion 16 is mounted to the back plate 15, a printed circuit board (PCB) 35 is mounted in the housing portion 16 by, for example, screws 37 and 38, as shown in FIG. 3. For the sake of clarity of description of FIG. 3, the circuitry of the PCB 35 is not shown in FIG. 3 but is shown in each of FIGS. 4 and 5 and, thus, will be described later. A tap cable TC coupled to one of the stations $S_1$–$S_{N-X}$ (FIG. 1) is then coupled to a receptacle means 39 (to be explained) by means of a coupler 41, such as a monaural or stereo plug. One or two trunk or coaxial cables $11_A$ and $11_B$ are then coupled to the housing portion 16.

As shown in FIG. 1 only one coaxial cable is needed to be connected to each of the first and last tap boxes along the single communications path 11. More specifically, tap box $TB_1$ has only an output coaxial cable $11_1$ since $TB_1$ is the first tap box being utilized in the path 11 (by station $S_1$) and is therefore at the start of the path 11. Similarly, tap box $TB_N$ has only an input coaxial cable $11_{N-1}$ since $TB_N$ is the last tap box being utilized in the path 11 (by station $S_{N-X}$) and is therefore at the end of the path 11. All intermediate tap boxes in the path 11 require both input and output coaxial cables. For example, tap box $TB_2$ has an input coaxial cable $11_1$ and an output coaxial cable $11_2$.

For purposes of illustration the tap box housing portion 16 in FIG. 3 is shown with both input and output coaxial cables $11_A$ and $11_B$. It should, however, be understood that if the tap box, of which this housing portion 16 is a part, were either the first or the last tap box being utilized in the path 11 by a station, only one of the cables $11_A$ and $11_B$ would be required.

In FIG. 3, the coaxial cables $11_A$ and $11_B$ are shown for a surface-mounted installation of a tap box. As a result, the cables $11_A$ and $11_B$ are routed through slots 27 and 28 and respectively clamped by clamps 43 and 45 to provide strain relief for the cables $11_A$ and $11_B$. Center conductors 47 and 49 of the respective cables $11_A$ and $11_B$ are connected to the PCB 35 via screws 51 and 53. Clamps 55 and 57 are utilized to respectively clamp shields (not shown) of the cables $11_A$ and $11_B$ to the metal housing portion 16 to complete the electrical connections of the cables $11_A$ and $11_B$ to the PCB 35. As is well known in the art, a shield of a coaxial cable is typically a braided conductor that surrounds and is separated from a center conductor (such as 47 or 49) by a dielectric. An insulating outer covering surrounds the shield and has to be selectively stripped off to expose a portion of the shield.

A shorting or terminating link 59 is pivotally connected to a terminating network (FIGS. 4 and 5) by a screw 61. When the housing portion 16 of FIG. 3 is part of an intermediate one of the tap boxes $TB_1$–$TB_N$, such as $TB_3$, a free end 63 of the link 59 is placed in an open or unconnected position, as shown in FIG. 3. However, when only one cable $11_A$, for example, is being used, the free end 63 of the shorting link 59 is connected to the screw 53 to couple the terminating network across the coaxial cable $11_A$ to terminate the path 11 (FIG. 1) in its characteristic impedance. Such a terminating network is coupled to the path 11 at both the beginning and ending of the path 11 to minimize reflections in the path 11.

After the housing portion 16 is fully assembled, as shown in FIG. 3, the metal lid 17 is snapped over the housing portion 16 to form an enclosed metal housing which provides electrical continuity to the components inside of that enclosed metal housing. In addition, the enclosed metal housing prevents signal radiation to the outside of that housing and further isolates the components in the tap box from external signal radiations. Finally, knockouts in the large plastic cover 18 (FIG. 2), such as knock-outs 65 and 67 are selectively removed in accordance with the direction that the cables $11_A$ and $11B$ are entering the housing portion 16. Here again, if only one cable is entering the housing portion 16, only one of the knock-outs would be removed. Other wise, two knock-outs would be removed. The plastic cover 18 is then snapped over the enclosed metal housing consisting of housing portion 16 and lid 17. The plastic back plate 15 and large plastic cover 18 provide a resultant plastic housing to insulate a user from electrical shock due to, for example, lightning or power surges.

Figure 4:
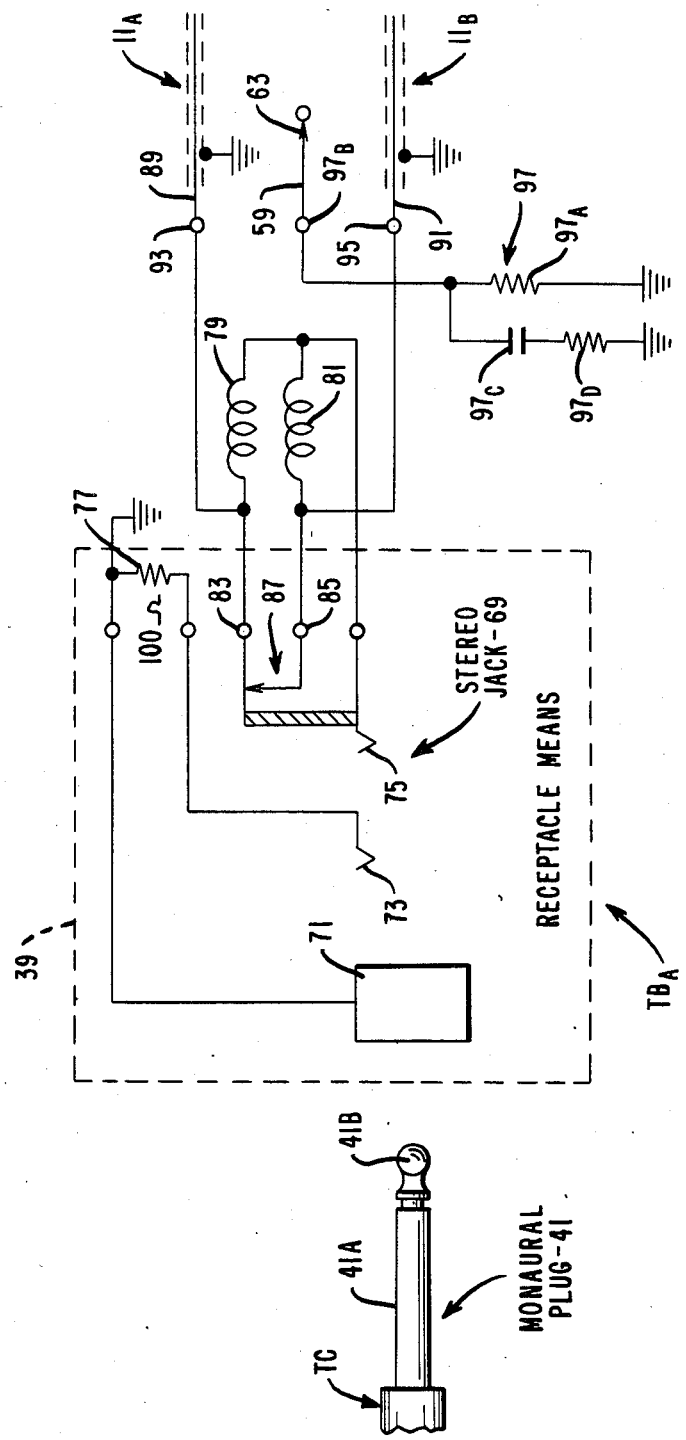
FIG. 4 is a schematic diagram of a first embodiment of the invention.

Referring now to FIG. 4, a first embodiment of the invention will be discussed. A tap cable TC is connected at a first end (FIG. 1) to one of the stations $S_I$–$S_{N-X}$ and at a second end to the coupler or plug 41. As shown in FIG. 4, the coupler 41 is a monaural plug having a sleeve $41_A$ and a tip $41_B$. A receptacle means 39 in a tap box $TB_A$ is adapted to receive the plug 41 when it is desired to couple the station associated with the plug 41 into the path 11 via the path segments or coaxial cables $11_A$ and $11_B$.

In this first embodiment, the receptacle means 39 includes a stereo jack 69 having a grounded sleeve 71, a ring contact or first portion 73 and a tip contact or second portion 75. An exemplary 100 ohm resistor 77 is coupled between the sleeve 71 and ring contact 73 of the jack 69.

Serially connected inductors 79 and 81 are respectively coupled to contacts 83 and 85 of a switch 87, while the junction of the inductors 79 and 81 is connected to the tip contact 75. Center conductors 89 and 91 of the coaxial cables $11_A$ and $11_B$ are also respectively coupled to the contacts 83 and 85 by way of connection points 93 and 95 respectively.

When the plug 41 is not inserted into the stereo jack 69, the inductors 79 and 81 are shorted out by closed contacts 83 and 85 of the switch 87, as shown in FIG. 4. Thus, the center conductors 89 and 91 of the cables $11_A$ and $11_B$ are directly connected together.

When the plug 41 is partially inserted into the stereo jack 69, the sleeve $41_A$ and tip $41_B$ of the plug 41 respectively contact the sleeve 71 and ring contact 73 of the stereo jack 69. This connects the 100 ohm resistor 77 between the tip $41_B$ and sleeve $41_A$ of the tap cable plug 41. This resistor 77 provides the proper termination to the tap cable TC to enable its associated station to test itself. The contacts 83 and 85 of the switch 87 remain closed.

When the plug 41 is fully inserted into the stereo jack 69, the tip 41$_B$ of the plug 41 contacts the tip contact 75 of the stereo jack 69, causing the contacts 83 and 85 of the switch 87 to open. The inductors 79 and 81 are now connected in series with the coaxial cables 11$_A$ and 11$_B$, and the tap cable TC is now connected between the junction of the inductors 79 and 81 and ground by way of the tip contact 75 and sleeve 71, respectively, of the stereo jack 69. The resistor 77, which is not needed or used at this time, is shorted out by the sleeve 41$_A$ of the plug 41.

When two coaxial cables 11$_A$ and 11$_B$ are inputted to the tap box TB$_A$, the free end 63 of the shorting link 59 is in the open position, as shown in FIG. 4. However, when only one of the cables 11$_A$ and 11$_B$ is to used, the free end 63 of the shorting link 59, which link 59 is connected to a terminating network 97, is positioned to make electrical contact with that one of the connection points 93 and 95 not connected to a coaxial cable. The network 97 may include, for example, a resistor 97$_A$ coupled between a connection point 97$_B$ and ground and also coupled across a serially-connected capacitor 97$_C$ and resistor 97$_D$ combination. The components in the network 97 are so selected that the impedance of the terminating network 97 is approximately equal to the characteristic impedance of the path 11. Thus, the link 59 places the network 97 across the coaxial cable 11$_A$ or 11$_B$ to terminate the path 11 in its characteristic impedance and minimize reflections in the path 11.

Figure 5:
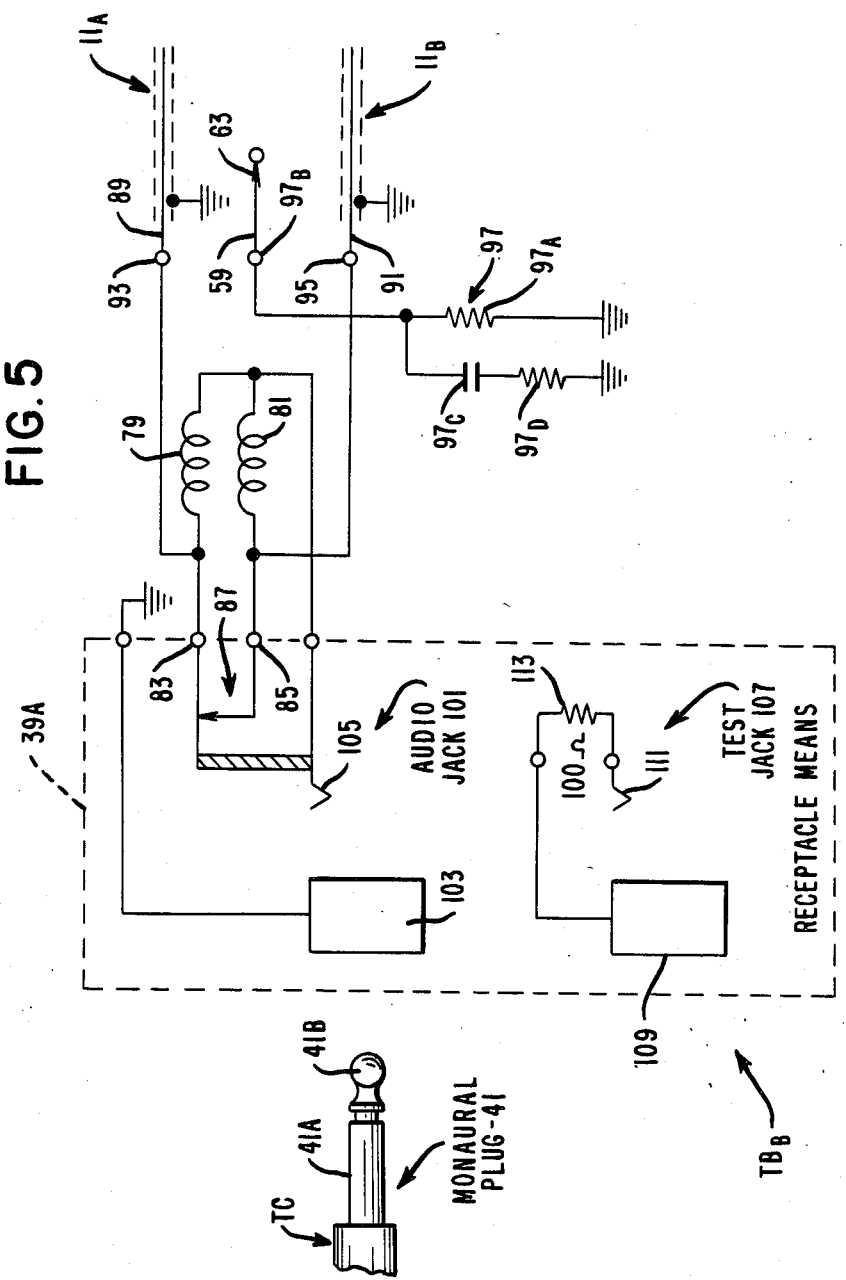
FIG. 5 is a schematic diagram of a second embodiment of the invention.

Referring now to FIG. 5, a second embodiment of the invention will now be discussed. Essentially, the major difference between the embodiments of FIGS. 4 and 5 relates to different receptacle means used in FIGS. 4 and 5. The remaining components in FIG. 5 are similar in structure and operation to the corresponding components in FIG. 4 and, hence, require no further explanation.

In FIG. 5 a receptacle means 39A used in a tap box TB$_B$ includes an audio jack 101 having a sleeve 103 and a tip contact 105, and a test jack 107 having a sleeve 109 and a tip contact 111. A 100 ohm terminating resistor 113 is coupled between the sleeve 109 and tip contact 111 of the test jack 107.

In operation, when the plug 41 is not inserted into either of the jacks 101 and 107, the inductors 79 and 81 are again shorted out by the closed contacts of the switch 87. Thus, the center conductors 89 and 91 of the cables 11$_A$ and 11$_B$ are directly connected together. The terminating resistor 113 is not connected.

When the plug 41 is inserted into the test jack 107, the sleeve 41$_A$ and tip 41$_B$ of the plug 41 respectively contact the sleeve 109 and tip contact 111 of the test jack 107. This connects the terminating resistor 113 between the sleeve 41$_A$ and tip 41$_B$ of the tap cable plug 41 to enable the station associated with the tap cable TC to test itself by way of a loop test. The contacts 83 and 85 of the switch 87 remain closed, thereby keeping the inductors 79 and 81 shorted out.

When the plug 41 is inserted into the audio jack 101, the tip 41$_B$ of the plug 41 makes contact with the tip contact 105 of the jack 101, causing the contacts 83 and 85 of the switch 87 to open. The inductors 79 and 81 are now connected in series with the coaxial cables 11$_A$ and 11$_B$, and the tap cable TC is now connected between the junction of the inductors 79 and 81 and ground by way of the tip contact 105 and sleeve 103 of the jack 101.

It should be noted at this time that in both of the embodiments of FIGS. 4 and 5, the total inductance of the inductors 79 and 81 is so chosen that this total inductance of the inductors 79 and 81, the capacitance of the tap cable TC itself, and the capacitance presented by the associated station effectively present an equivalent circuit which simulates or approximates the characteristic impedance of the path 11.

The invention thus provides a system for selectively coupling a plurality of stations into a single communications path which includes a sequence of tap boxes. Any of the stations can be coupled into, decoupled from, or repositioned in the single communications path without degrading the communications link.

While the salient features of the invention have been illustrated and described, it should be readily apparent to those skilled in the art that many changes and modifications can be made in the system of the invention presented without departing from the spirit and true scope of the invention. Accordingly, the present invention should be considered as encompassing all such changes and modifications of the invention that fall within the broad scope of the invention as defined by the appended claims.

We claim:

1. In a communications network having a plurality of stations including first and last stations and a single communications path having a preselected characteristic impedance, a system for selectively coupling the plurality of stations into the single communications path, said system comprising:

a plurality of tap boxes serially coupled into the single communications path; and a plurality of connection means for selectively coupling the stations to selected ones of said plurality of tap boxes, each of said tap boxes comprising:

a first impedance equivalent to the characteristic impedance of the single communications path;

a test impedance; and receptacle means having a first portion and being responsive to the coupling of a said connection means to said first portion for coupling said first impedance serially into the single communications path and for coupling the station associated with said connection means into the single communications path by way of said first impedance, said receptacle means having a second portion and being responsive to the coupling of said connection means to said second portion for coupling said test impedance to said connection means to enable the station associated with said connection means to test itself.

2. The system of claim 1 wherein each of said plurality of connection means includes:

a monarural plug having a plurality of contact portions for selectively engaging said first and second portions of the tap box upon insertion of the plug within the tap box; and a coaxial cable coupled between an associated station and said monaural plug.

3. The system of claim 2 wherein said receptacle means includes:

an audio jack, said audio jack being said first portion;

a test impedance; and a test jack being responsive to the insertion of said monaural plug therein for coupling said test impedance to said monaural plug to enable the associated station to test itself.

4. The system of claim 3 wherein said test impedance includes:

a resistor of a preselected resistance.

5. The system of claim 3 wherein each of said plurality of tap boxes further includes:
   a terminating impedance equivalent to the characteristic impedance of the single communications path;
   said terminating impedances in those of said tap boxes respectively coupled to the first and last stations being coupled to the single communication path to terminate the single communications path in its characteristic impedance at both ends of the single communications path.

6. The system of claim 5 wherein said first impedance includes:
   first and second serially connected inductors.

7. The system of claim 6 wherein said terminating impedance includes:
   a terminating network.

8. The system of claim 7 wherein said test impedance includes:
   a resistor of a preselected resistance.

9. In a communications network having a plurality of stations including first and last stations and a single communications path having a preselected characteristic impedance, a system for selectively coupling the plurality of stations into the single communications path, said system comprising:
   a plurality of tap boxes serially connected into the single communications path; and a plurality of connection means for selectively coupling the stations to selected ones of said plurality of tap boxes, each of said tap boxes comprising:
   a first impedance equivalenet to the characteristic impedance of the single communications path;
   a terminating impedance equivalent to the characteristic impedance of the single communications path;
   said terminating impedance in those of said tap boxes resepctively coupled to the first and last stations being coupled to the single communications path to terminate the single communications path in its characteristic impedance at both ends of the single communications path; and
   receptacle means having a first portion and being respolnsive to the coupling of a said connection means to said first portion for coupling said first impedance serially into the single communications path and for coupling the station associated with said connection means into the single communications path by way of said first impedance.

10. The system of claim 9 wherein said first impedance includes:
    first and second serially connected inductors.

11. The system of claim 10 wherein said first and second serially-connected inductors include:
    a center connection at the junction of said first and second inductors being coupled to said first portion of said receptacle means.

12. The systems of claim 10 wherein said terminating impedance includes:
    a terminating network.

13. The system of claim 12 wherein said terminating network includes:
    a first resistor and a capacitor serially connected together to form a combination; and
    a second resistor coupled across said combination.

14. The system of claim 9 wherein each of said plurality of connection means includes a monaural plug and said receptacle means includes:
    a test impedance; and
    a stereo jack being responsive to the coupling of said monaural plug to said second portion for coupling said test impedance to said monaural plug to enable the associated station to test itself.

15. The system of claim 14 wherein said test impedance includes:
    a resistor of a preselected resistance.

16. The system of claim 14 wherein each of said plurality of tap boxes further includes:
    a terminating impedance equivalent to the characteristic impedance of the single communications path;
    said terminating impedances in those of said tap boxes respectively coupled to the first and last stations being coupled to the single communications path to terminate the single communications path in its characteristic impedance at both ends of the single communications path.

17. The system of claim 16 wherein said first impedance includes:
    first and second serially connected inductors.

18. The system of claim 17 wherein said terminating impedance includes:
    a terminating network.

19. The system of claim 18 wherein said terminating network includes:
    a first resistor and a capacitor serially connected together to form a combination; and
    a second resistor coupled across said combination.

20. The system of claim 18 wherein said test impedance includes:
    a resistor of a preselected resistance.

* * * * *

UNITED STATES PATENT AND TRADEMARK OFFICE
CERTIFICATE OF CORRECTION

PATENT NO. : 4,682,325

DATED : July 21, 1987

INVENTOR(S) : George Heys, Jr. et al.

It is certified that error appears in the above—identified patent and that said Letters Patent is hereby corrected as shown below:

Column 7, line 43, delete "respolnsive" and substitute --responsive--.

Column 8, line 19, after "jack" insert --having said first portion and a second portion, said stereo jack--.

Signed and Sealed this

Third Day of November, 1987

Attest:

DONALD J. QUIGG

Attesting Officer

Commissioner of Patents and Trademarks